(12) United States Patent
Bhattacharyya (10) Patent No.: US 7,224,002 B2
(45) Date of Patent: May 29, 2007

(54) SILICON ON INSULATOR READ-WRITE NON-VOLATILE MEMORY COMPRISING LATERAL THYRISTOR AND TRAPPING LAYER

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 10/840,792

(22) Filed: May 6, 2004

(65) Prior Publication Data

US 2005/0247962 A1 Nov. 10, 2005

(51) Int. Cl.
*H01L 29/74* (2006.01)

(52) U.S. Cl. .................. 257/110; 257/113; 257/133; 257/E21.388; 257/146

(58) Field of Classification Search ............... 257/110, 257/113, 146
See application file for complete search history.

(56) References Cited

U.S. PATENT DOCUMENTS 4,692,785 A * 9/1987 Wada ................. 257/315

5,838,026 A * 11/1998 Kitagawa et al. ........... 257/139

(Continued)

OTHER PUBLICATIONS

U.S. Appl. No. 10/612,793, filed Jul. 2, 2003, Bhattacharyya.
Farid Nemati et al., "A Novel High-Density, Low Voltage SRAM Cell with a Vertical NDR Device," 1998 Symp. on VLSI Tech. Digest of Technical Papers, § 7.3, p. 66-67 (1998).

(Continued)

*Primary Examiner*—Andy Huynh
*Assistant Examiner*—Dao H. Nguyen
(74) *Attorney, Agent, or Firm*—Wong, Cabello, Lutsch, Rutherford and Brucculeri, L.L.P.

(57) ABSTRACT

Disclosed herein is an improved thyristor-based memory cell. In one embodiment, the cell is formed in a floating substrate using Silicon-On-Insulator (SOI) technology. The cell preferably incorporates a lateral thyristor formed entirely in the floating substrate, and which is gated by a second word line. The cathode of the thyristor also comprises a source of an access transistor, whose drain is connected to the bit line of the device, and which is gated by a first word line. A trapping layer is built into the floating substrate, and when writing to the cell, pulses are added to cause holes to be trapped on the trapping layer for a logic state '1' and to cause electrons to be trapped on the trapping layer for a logic state '0.' Trapping of charges on the trapping layer adds extra margin to the stored data states, prevents their degradation, and renders the cell non-volatile.

51 Claims, 12 Drawing Sheets

U.S. PATENT DOCUMENTS

| | | | |
|---|---|---|---|
| 6,049,109 A * | 4/2000 | Omura et al. | 257/347 |
| 6,229,161 B1 | 5/2001 | Nemati et al. | |
| 6,462,359 B1 | 10/2002 | Nemati et al. | |
| 6,538,916 B2 | 3/2003 | Ohsawa | 365/149 |
| 6,625,057 B2 | 9/2003 | Iwata | 365/158 |
| 6,653,665 B2 * | 11/2003 | Kajiyama | 257/133 |
| 6,872,602 B1 * | 3/2005 | Nemati et al. | 438/135 |
| 6,885,581 B2 | 4/2005 | Nemati et al. | 365/159 |
| 6,906,354 B2 * | 6/2005 | Hsu et al. | 257/107 |
| 2004/0041206 A1 | 3/2004 | Bhattacharyya | 29/792 |
| 2004/0041208 A1 | 3/2004 | Bhattacharyya | 27/1 |
| 2004/0041212 A1 | 3/2004 | Bhattacharyya | 29/76 |

OTHER PUBLICATIONS

Farid Nemati et al., "A Novel Thyristor-Based SRAM Cell (T-RAM) for High Speed, Low-Voltage, Giga-Scale Memories," IEDM, 11.5.1, p. 283-286 (1999).

S. Okhonin et al., "A SOI Capacitor-less IT-DRAM Concept," 2001 IEEE International SOI Conference, 0-7803-6739-1/01 (Oct. 1, 2001).

P. Fazan et al., "Capacitor-less IT-DRAM Concept," 2002 IEEE International SOI Conference, p. 10-13, 0-7803-7439-b/02 (Oct. 2, 2002).

* cited by examiner

SILICON ON INSULATOR READ-WRITE NON-VOLATILE MEMORY COMPRISING LATERAL THYRISTOR AND TRAPPING LAYER

FIELD OF THE INVENTION

This invention relates to a memory cell design for an integrated circuit.

BACKGROUND

Many different types of memory cell designs exist in the art, each with its own advantages and disadvantages. For example, a dynamic random access memory (DRAM) cell comprises a capacitor and an access transistor. Such a cell design is beneficial in that it can be made very dense. However, DRAM cells are volatile, meaning the cells loose their stored data after power is removed from the device. Moreover, DRAM cells, even when powered, must be periodically refreshed to retain their data states. A static random access memory (SRAM) cell is beneficial in that it can be accessed very quickly. However, SRAM cells draw relatively large amounts of current and are not terribly dense as they typically require 4 or 6 transistors in the design of a single cell. Moreover, such cells, like DRAM cells, are also volatile. Electrically erasable programmable read only memory (EEPROM) cells, such as flash cells, are non-volatile and relatively dense and quick to read. However, such cells take time to write and erase, and are subject to wearing out after a certain number of write/erase cycles.

Thus, the art continues to search for a memory cell design that has the benefits of the previously-mentioned cells designs without their negative aspects. In this regard, Silicon (or Semiconductor)-on-insulator (SOI) technologies provide interesting alternatives. For example, in S. Okhonin et al., "A SOI Capacitor-less 1T-DRAM Concept," 2001 IEEE International SOI Conference, 0-7803-6739-1/01 (Oct. 1, 2001), and P. Fazan et al., "Capacitor-less 1T-DRAM Concept," 2002 IEEE International SOI Conference, pg. 10–13, 0-7803-7439-b/02 (Oct. 2, 2002), both of which are hereby incorporated by reference in their entireties, it was suggested to fabricate a DRAM cell using a single transistor. The state of the memory cell is defined by the floating body potential and thereby the associated conductance of the SOI transistor. The body potential, and hence the logic '1' and '0' memory states, is altered by incorporating excess holes (positive charges) or excess electrons (negative charges) in the floating body of the memory transistor. However, this cell is volatile, and moreover could suffer from reliability and hysteretic problems which would ultimately affect cell performance and memory state retention. Moreover, like a typical DRAM cell, it needs to be refreshed.

A non-volatile version of a one-transistor SOI floating-body RAM cell was also proposed in U.S. Published Patent Applications U.S. 2004/0041206 (Ser. No. 10/425,483, filed Apr. 29, 2003) and 2004/0041208 (Ser. No. 10/232,846, file Aug. 30, 2002) by the present inventor, which are hereby incorporated by reference in their entireties. In these applications, a charge trapping layer is added underneath the access transistor to provide a material on which charge can be stored. The improved one-transistor cell is thus non-volatile, and additionally enjoys improved scalability, reliability, and performance.

Another one-transistor cell approach is disclosed in U.S. patent application Ser. No. 10/612,793, filed Jul. 2, 2003 by the present inventor, which is hereby incorporated by reference in its entirety. In this approach, a p-i-n diode is attached to one of the source/drain regions of the transistor, and the logic level of the cell is stored in the intrinsic region, which acts essentially as a dielectric. The p-i-n diode can be separately gated from the gating of the access transistor, and essentially functions as a negative-differential-resistance (NDR) device. However, this cell design is volatile and requires refreshing, thus limiting its utility.

Other NDR approaches have been proposed in the art using thyristors. For example, in Farid Nemati et al., "A Novel High-Density, Low Voltage SRAM Cell with a Vertical NDR Device," 1998 Symp. on VLSI Tech. Digest of Technical Papers, § 7.3, pg. 66–67 (1998), and Farid Nemati et al., "A Novel Thyristor-Based SRAM Cell (T-RAM) for High Speed, Low-Voltage, Giga-Scale Memories," IEDM, 11.5.1, pg. 283–286 (1999), (the "Nemati references") both of which are hereby incorporated by reference in their entireties, it was suggested to use a negative-differential-resistance (NDR) vertical thyristor (a p-n-p-n device) in conjunction with an access transistor, yielding a cell design analogous in performance to an SRAM cell. The thyristor is gated during write operations to improve turn-on and turn-off speeds. Such a cell is SRAM-like in performance but DRAM-like in density. Again, however, the cell is volatile and requires refreshing.

In another thyristor approach disclosed in U.S. Published Patent Application 2004/0041212 (Ser. No. 10/232,855, filed Aug. 30, 2002) (the "'212 application"), which is hereby incorporated by reference in its entirety, a gated thyristor was used in a one-transistor cell. The thyristor couples to an epitaxially-raised source of the access transistor and is stacked over the access transistor, using metal-induced lateral crystallization techniques. Thus, in this thyristor-based approach, the thyristor is not formed exclusively in the substrate, and is in a sense partially lateral and partially vertical in nature. However, by forming portions of the thyristor laterally over the access transistor, a dense cell with faster performance can be fabricated. But such a cell is also relatively complicated to manufacture, and again is volatile and requires refreshing.

Figure 1:
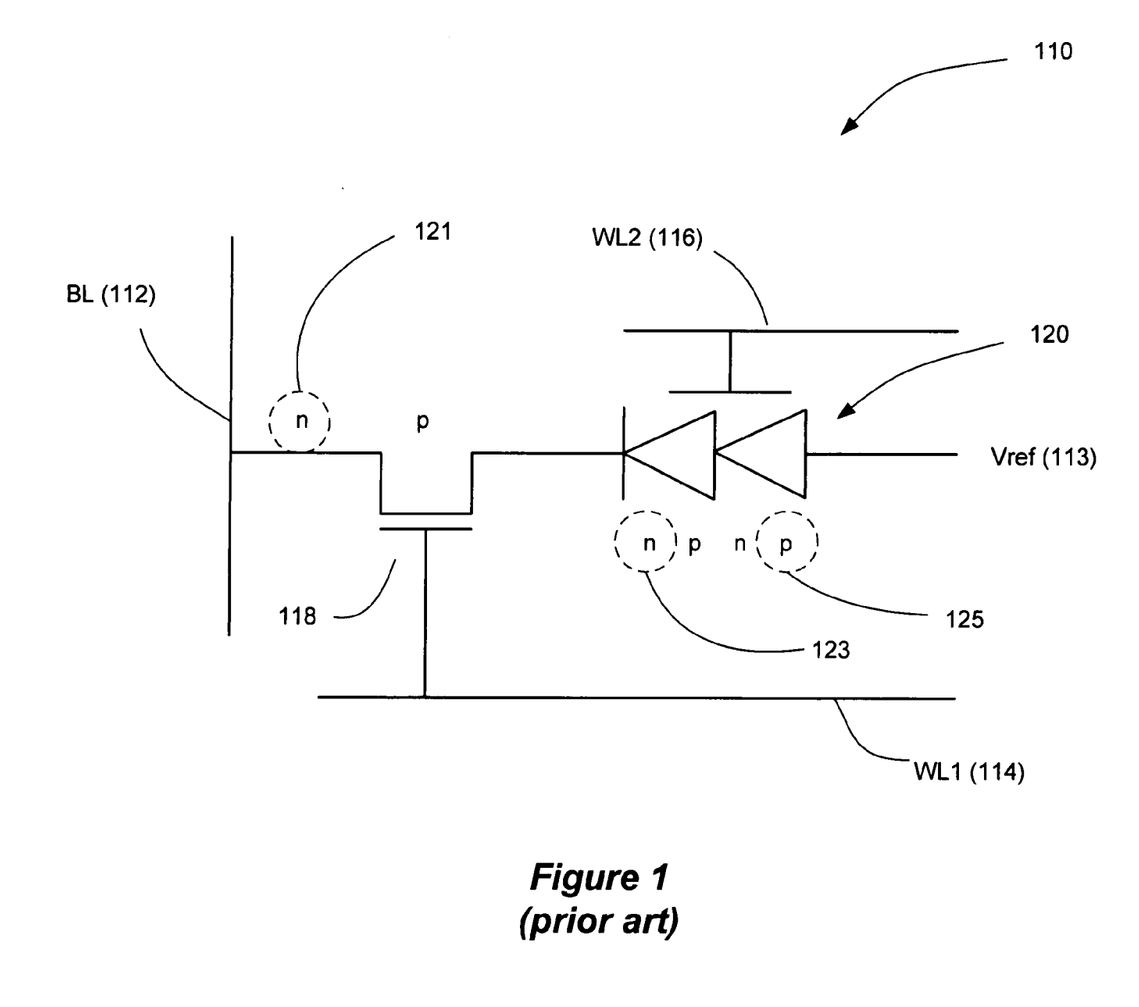
FIG. 1 illustrates a circuit schematic of a prior art thyristor-based gated memory cell.

An exemplary schematic of the thyristor-based approaches referenced above (e.g., the Nemati reference and the '212 application) is shown in FIG. 1. The cell comprises an N-channel access transistor 118 whose n+ drain 121 is coupled to a bit line (BL) 112 and which is controlled by a first word line (WL1) 114. The access transistor 118 is serially coupled to a thyristor 120, which, because of its p-n-p-n structure, is drawn as two serially connected diodes. The n+ source 123 of the access transistor 118 comprises an end (cathode) of the thyristor 120, and comprises the storage node of the cell where a logic state '0' or '1' is stored, as will be explained later. The thyristor 120 is gated by a second word line (WL2) 116, which improves the switching speed of the cell. The other end (anode) of the thyristor 120, p+ region 125, is coupled to a reference voltage (Vref), which is set somewhere between the operating voltage of the device (Vcc; approximately 2.0 to 2.5 Volts) and ground (0 Volts), and which may be 1.0 Volts or so.

Figure 2:
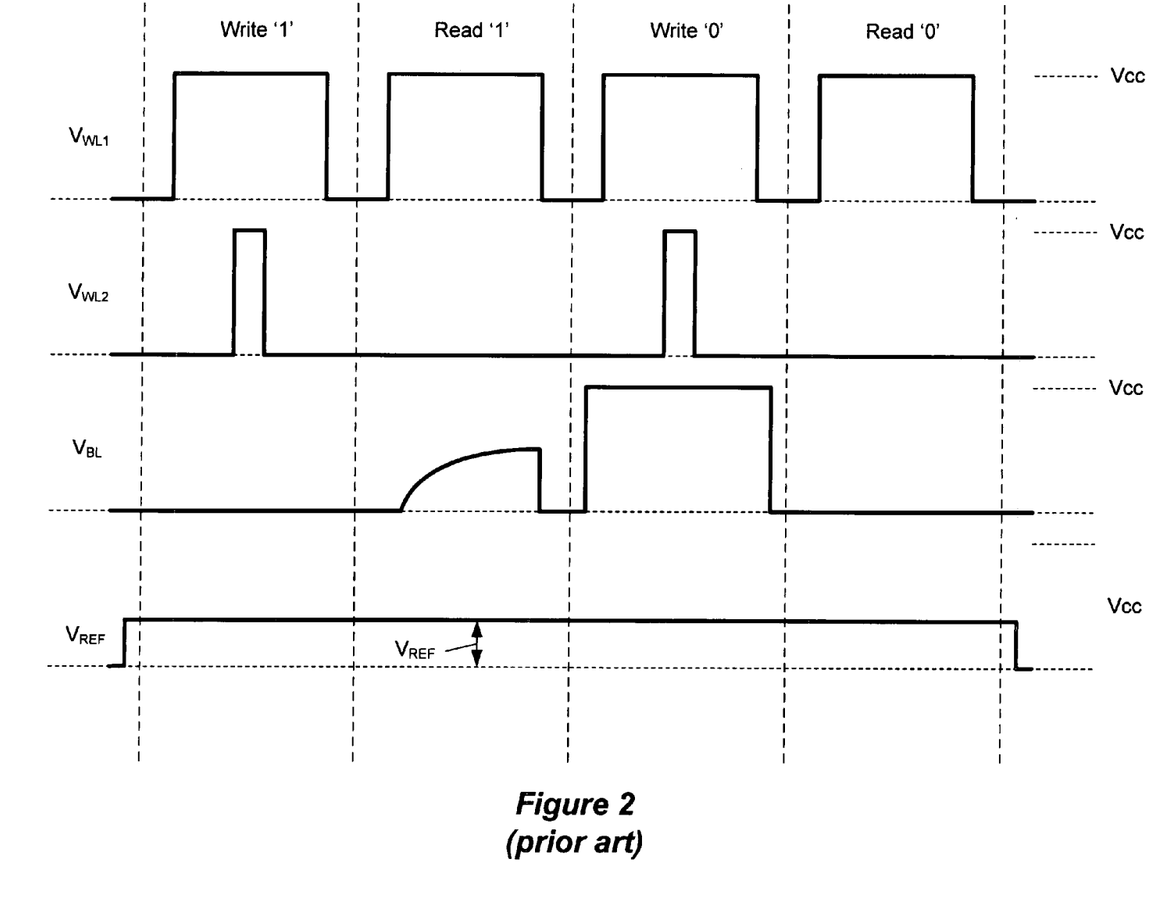
FIG. 2 illustrates the conditions for writing and reading the memory cell of FIG. 1.

FIG. 2 represents conditions for writing and reading the cell of FIG. 1. When writing a logic '1' state to the cell, both word lines 114 and 116 are turned on, and the bit line 112 stays low. The storage (cathode) node 123 assumes the bit line potential (low) while the p+ region (anode) 125 of the thyristor 120 remains at the reference voltage (Vref). This forward biases the thyristor 120, causing it to exceed its break over voltage (see FIG. 3), thus entering a highly conductive state. As a result, the potential of the storage node 123 is raised to nearly Vref and the junctions in the thyristor are saturated. Thereafter, when the first word line 114 is shut off, a charge remains on the storage node 123 equivalent to the raised potential, which represents a logic '1' state. This charge can then be subsequently read by gating the first word line 114, and sensing the rise of potential on the bit line 112.

Writing a logic state '0' implies the removal of all positive charges from the storage node 123 caused by earlier saturation. To write a logic '0', and as shown in FIG. 2, first the bit line 112 is brought high, and a short time later the first word line 114 is brought high. Thereafter, the second word line 116 is gated, which significantly enhances the removal of any excess positive carriers previously stored. After the first word line 114 is shut off, the bit line 112 remains high for a short period, which ensures the removal of such positive carriers through the bit line 112 by strongly turning on transistor 118. As no charge is stored on the storage node 123 when in the logic '0' state, no charge will flow to the bit line 112 when the '0' is read by gating on the first word line 114. Accordingly, the potential on the floating bit line 112 remains unchanged, as shown in FIG. 2.

Figure 3:
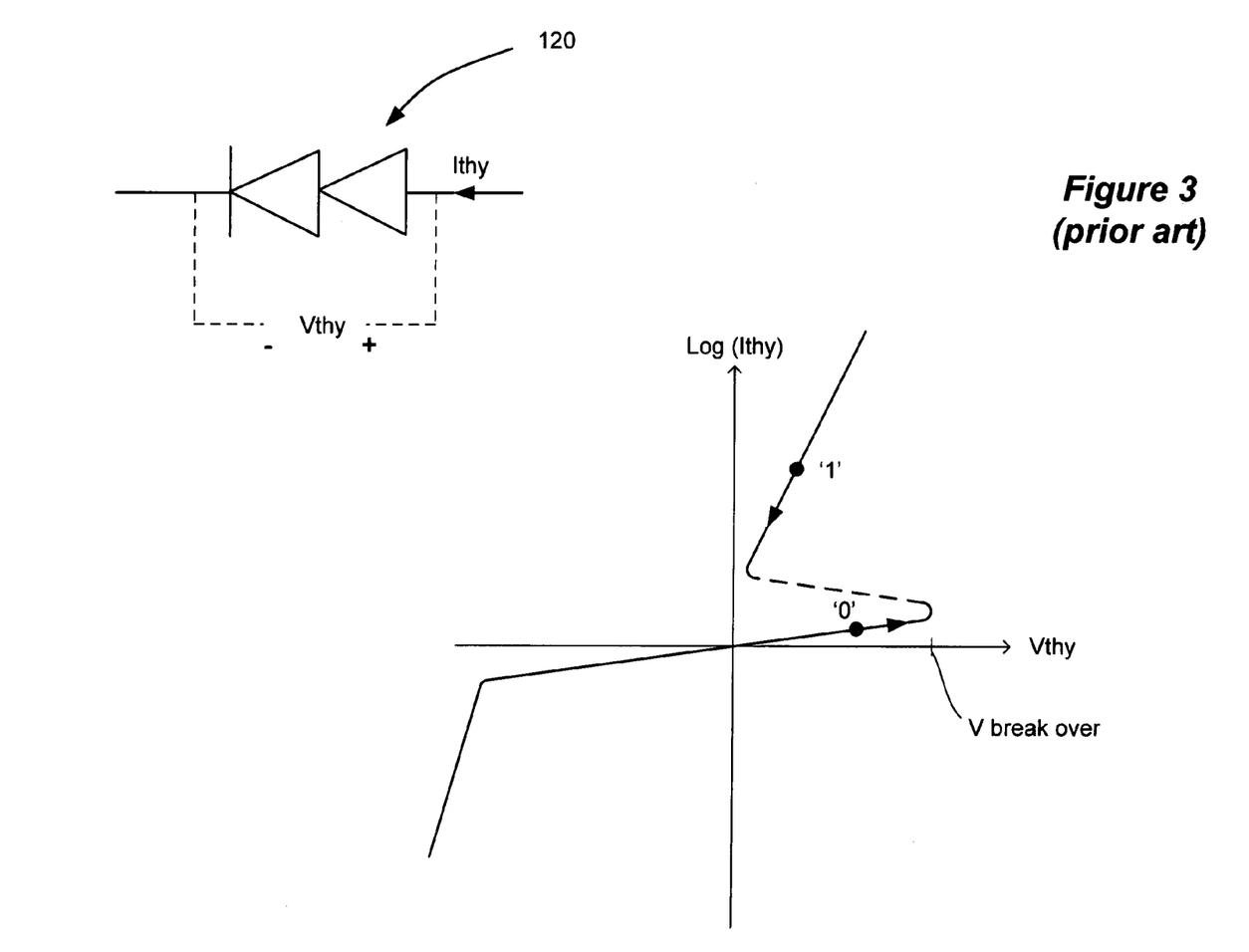
FIG. 3 illustrates an I-V curve for the thyristor of the memory cell of FIG. 1, and shows pseudo-stable logic '0' and '1' states for the cell.

During standby, when the cell is neither read nor written to, the logic '0' and '1' data states are reflected in the I-V curve for the thyristor 120, as shown in FIG. 3. However, these data states are not perfectly stable. As noted earlier, when a logic '1' is stored, a positive potential floats on storage node 123 by virtue that the junctions surrounding this node are reverse biased. However, with time, the positive potential on the storage node 123 will drop due to finite leakage mechanisms, e.g., thermal recombination of holes with electrons across depletion layer of the reverse biased junctions, as reflected in the arrow on FIG. 3. Such degradation in the logic '1' data state will occur along a time scale on the order of tens of milliseconds. Similarly, the logic '0' data state will also degrade. Specifically, the storage node 123, which is grounded when storing a '0,' will slowly rise is potential due to radiation effects and/or ground noise transmissions along a time scale again on the order of tens of milliseconds.

The resulting effect is a reduction in margin between the logic '1' and '0' states, which affects the integrity of the data states and ultimately performance of the memory device. Accordingly, to ensure high performance, periodic refreshing may be required to ensure sufficient margin between the data states, as is the case with a standard DRAM cell. Moreover, this thyristor-based approach is volatile, as the stored data states would be lost when power is removed from the device. The degradation of the data states of such thyristor-based memory cells, the need to refresh them, and their volatility, are not optimal.

Accordingly, each of the aforementioned cells has drawbacks that hamper their utility. The art would be benefited from a cell design that had DRAM-type densities, SRAM-like performance (quick speed), is non-volatile, and which is reliable and relatively easy to manufacture. This disclosure presents such a solution.

SUMMARY

Disclosed herein is an improved thyristor-based memory cell. In one embodiment, the cell is formed in a floating substrate using Silicon-On-Insulator (SOI) technology. The cell preferably incorporates a lateral thyristor formed entirely in the floating substrate, and which is gated by a second word line. The cathode of the thyristor also comprises a source of an access transistor, whose drain is connected to the bit line of the device, and which is gated by a first word line. A trapping layer is built into the floating substrate, and when writing to the cell, pulses are added to cause holes to be trapped on the trapping layer for a logic state '1' and to cause electrons to be trapped on the trapping layer for a logic state '0.' Trapping of charges on the trapping layer adds extra margin to the stored data states, prevents their degradation, and renders the cell non-volatile.

BRIEF DESCRIPTION OF THE DRAWINGS

Embodiments of the inventive aspects of this disclosure will be best understood with reference to the following detailed description, when read in conjunction with the accompanying drawings, in which:

FIG. 8A–8K illustrate using cross sectional views the steps for fabricating the improved memory cell of FIGS. 4 and 5.

DETAILED DESCRIPTION

Figure 4:
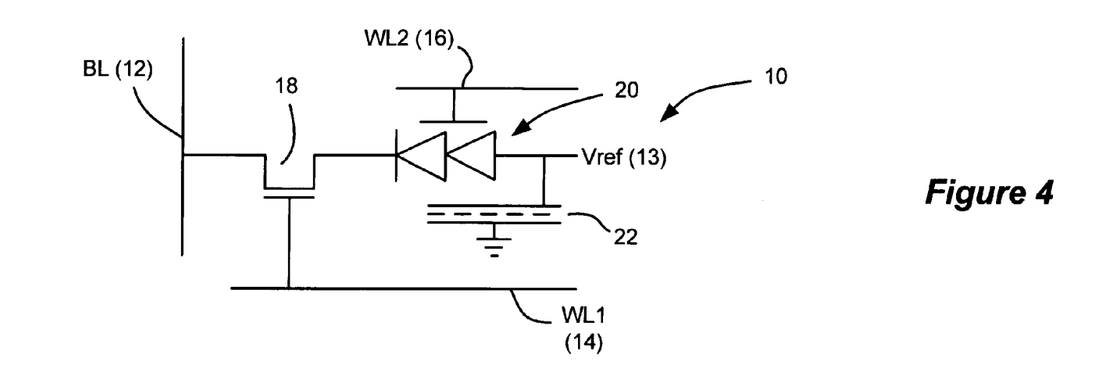
FIG. 4 illustrates a circuit schematic of an embodiment of the improved thyristor-based gated memory cell of the invention.
Figure 5:
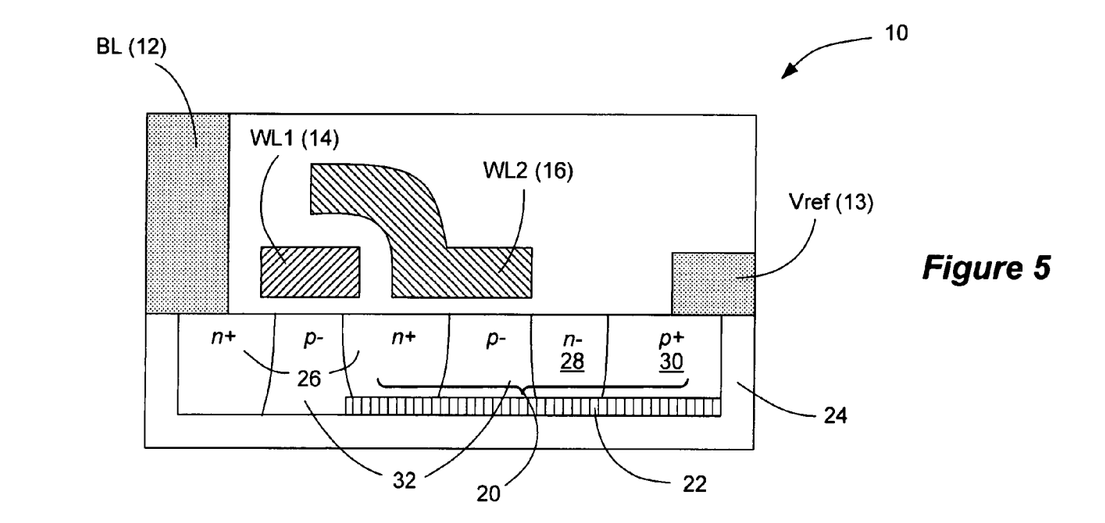
FIG. 5 illustrates a cross-sectional view of the cell of FIG. 4, showing the use of a trapping layer and an insulated floating substrate for the cell.

A circuit schematic and a cross sectional view of an improved thyristor-based cell design 10 are shown in FIGS. 4 and 5 respectively. The cell 10 comprises elements similar to the thyristor-based cell of FIG. 1, but is different in several different aspects. First, the improved cell 10 is preferably, but not necessarily, formed using Silicon-On-Insulator technology, thus providing a substrate for each cell which is floating. As will be explained later, this allows the cell to draw lower currents, and to use the floating body effect to improve the data retention capabilities of the cell. Second, the cell design preferably, but not necessarily, incorporates a lateral thyristor formed entirely in the floating silicon substrate. This makes the cell relatively easy to manufacture compared to vertical thyristor-based cells (e.g., the Nemati references) or cells requiring thyristors formed at least in part over the substrate (e.g., the '212 application). Furthermore, the insulated and floating substrate for each cell preferably, but not necessarily, comprises a trapping layer 22 which is used to provide non-volatility to the cell and to help keep the data states from degrading with time. The disclosed cell thus has improved non-volatility, is fast to access, and has a dense layout which is easy to manufacture.

Figure 6:
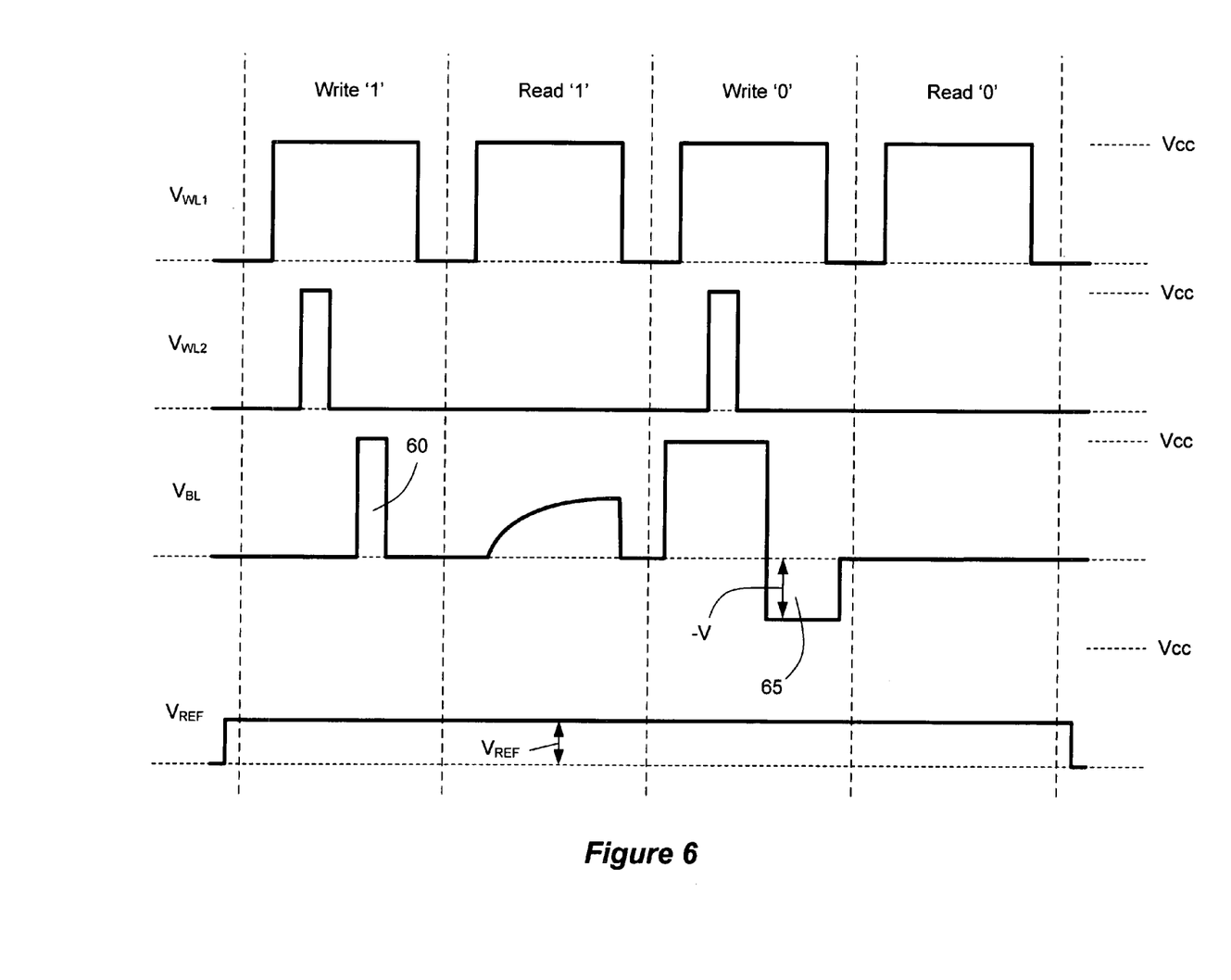
FIG. 6 illustrates the conditions for writing and reading the memory cell of FIGS. 4 and 5, including the provision of extra pulses for trapping electrons or holes in the trapping layer.

FIG. 6 shows the conditions for writing and reading the improved cell design 10. For the most part, the writing/ reading conditions do not differ from the cell disclosed in FIGS. 1–3. However, writing is preferably modified to promote the storage of charges on the trapping layer 22 to improve cell performance. These trapped charges are generally quite stable, and will remain for the operation lifetime of the device (e.g., 10 years) even if power is removed from the device. Thus, unlike previous known thyristor-based memory cell approaches, the disclosed cell design is non-volatile.

Figure 7:
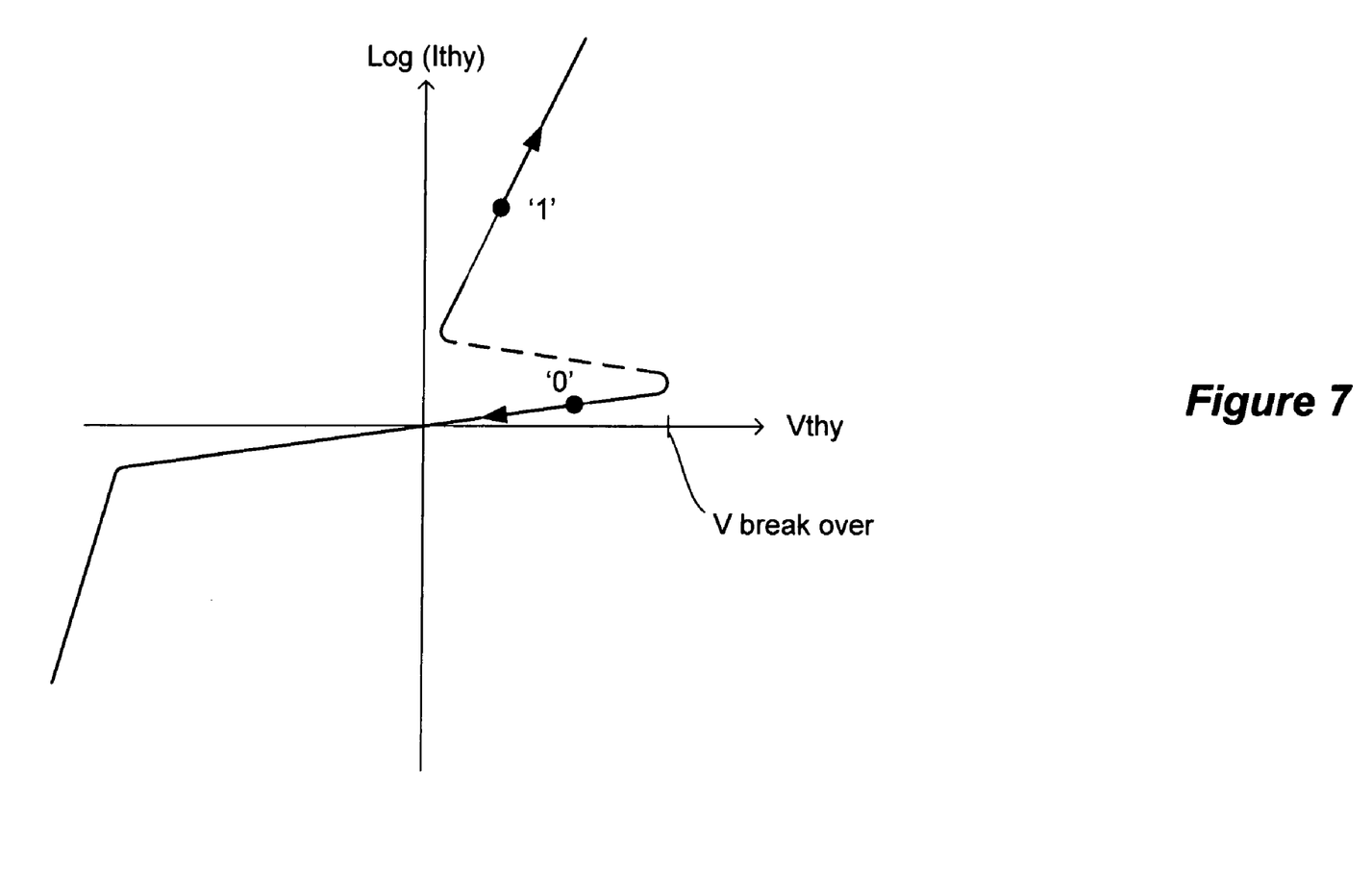
FIG. 7 illustrates an I–V curve for the thyristor of the memory cell of FIGS. 4 and 5, and shows improvement in the margin for the logic '0' and '1' states for the cell.

When writing a logic '1' to the cell, after thyristor gating has ceased via second word line 16, and while the first word line 14 is still high, the bit line 12 is pulled high (pulse 60) to Vcc, the operating voltage of the device. The access transistor 18 is strongly turned on and consequently generates excess holes in the floating body of the cell 10. These excess holes drift to the trapping layer 22 where they are trapped. The trapping of holes in the trapping layer 22 builds up a positive potential, which further gates the thyristor 20, even after second word line 16 has been turned off. Accordingly, the thyristor 20 is turned more strongly on than it otherwise would be when storing a logic '1' state, as reflected by the increase in current reflected by the arrow in FIG. 7. Extra margin is thus added to overcome the effect of degradation of the logic '1' data state as discussed earlier. Moreover, the positive potential of the trapped holes gates the thyristor 20, thus maintaining the thyristor 20 into the "on" state, even if power is removed from the device. Accordingly, the cell maintains the logic '1' state even after power is removed. Additionally, the speed of switching for the logic '1' states is hastened, as the stored positive charge also reduces the threshold voltage of the access transistor. In short, the storing of positive charges on the trapping layer 22 generally acts to increase the conductance through the memory cell.

When writing a logic '0' to the cell, after thyristor gating has ceased via second word line 16, and while the first word line 14 is still high, the bit line 12 is pulled low (pulse 65) to −V, which may be −1.5 Volts or so. This forward biases the diode formed between the n+ drain (at the bit line) and the p− substrate, which generates electrons that become trapped in the trapping layer 22. The trapping layer 22 is thus negatively charged, which depletes the majority hole carriers from the channel region of the access transistor 18. This effect tends away from gating on the thyristor 20 and maintains a strong turn off condition for access transistor 18 with reduced leakage. Accordingly, the thyristor 20 is turned more strongly off than it otherwise would be when storing a logic '0' state, as reflected by the decrease in current reflected by the arrow in FIG. 7. Extra margin is thus added to overcome the effect of degradation of the logic '0' data state as discussed earlier. Moreover, the tendency of the trapped electrons to gate the thyristor 20 off coaxes the thyristor 20 and access transistor 18 into the "off" state, even if power is removed from the device, again promoting stability of the logic '0' state. Additionally, the stored negative charge also increases the threshold voltage of the access transistor. In short, the storing of negative charges on the trapping layer 22 generally acts to decrease the conductance through the memory cell.

Because the volume of the floating substrate portions 32 for each cell are small, and because these layers are thin, it is not necessary to store much charge on the trapping layer 22 to achieve the above-mentioned benefits.

Steps for fabricating the disclosed cell design are illustrated in FIGS. 8A–8K. One skilled in the art will appreciate that a cell having the disclosed functionality can be achieved in several different ways, and utilizing alternative process steps that are not shown. Thus, the illustrated process should only be understood as exemplary.

Figure 8A:
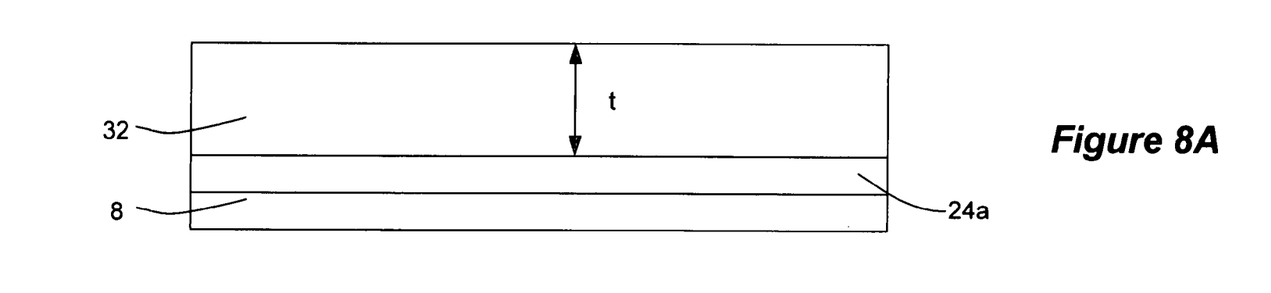

Processing starts with a substrate structure having a buried oxide layer 24a between two layers of crystalline material 8 and 32 (e.g., silicon), as shown in FIG. 8A. Such buried oxide starting substrates are commonly used in SOI technologies and are widely available. The crystalline silicon layer 32 upon which the active circuitry will be formed is a lightly p-doped silicon film that preferably may have a thickness "t" of approximately 1000 Angstroms or less. If necessary, this layer may be polished to achieve a suitable thickness.

Figure 8B:
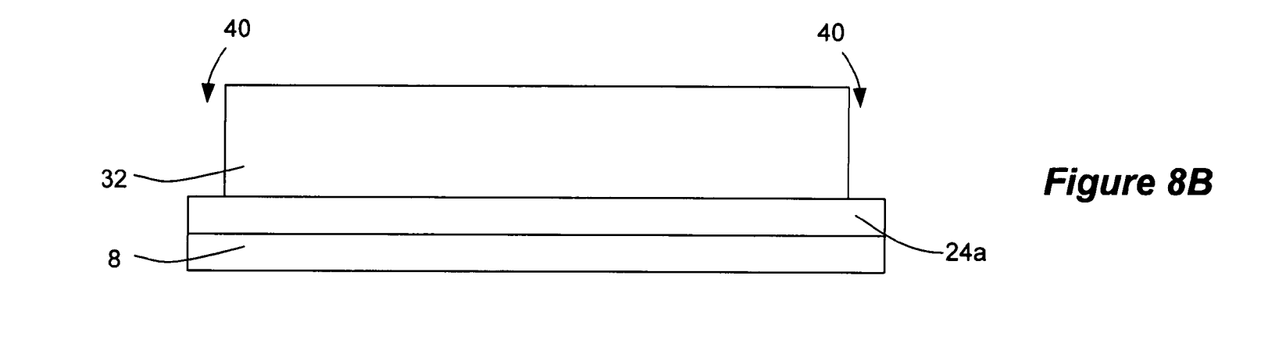
Figure 8C:
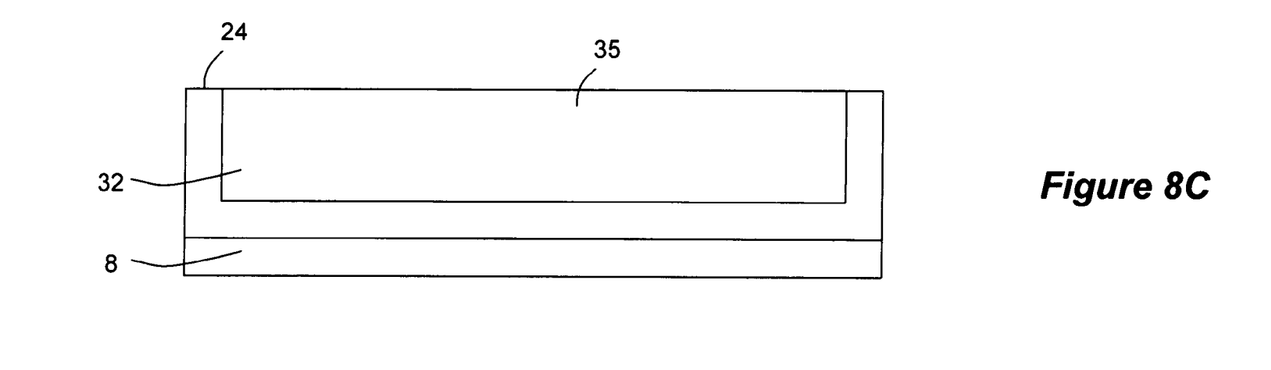

Referring to FIG. 8B, the substrate structure is masked (not shown) and trenches 40 are etched down to the buried oxide layer 24a. Although not shown, one skilled in the art will appreciate that the trench 40 surrounds the displayed crystalline silicon material 32 to in effect form a block of floating substrate 32 which will provide the active silicon 35 for one cell in an array (see FIGS. 8C and 9). Thereafter, and referring to FIG. 8C, a dielectric layer is deposited and etched or polished back to surround the floating substrate 32, which is now completely insulated on all sides (24).

Figure 8D:
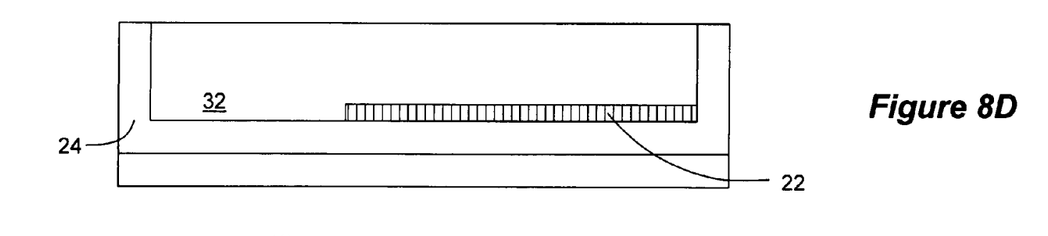

Referring to FIG. 8D, a portion of the floating substrate 32 is masked with an ion implantation mask (not shown) and a trapping layer 22 is formed by ion implantation. The trapping layer 22 preferably comprises a dielectric such as silicon oxynitride, silicon nitride, silicon-rich nitride, silicon-rich oxide, or alumina, although other materials capable of trapping charges can also be used. Further considerations relevant to forming the trapping layer can be found in above-incorporated U.S. Published Patent Applications 2004/0041208 and 2004/0041206. Alignment of the trapping layer 22 is not critical. However, it is preferred that the trapping layer be formed in the vicinity of the to-be-formed thyristor 20, although the trapping layer may also extend throughout the substrate region 32. Moreover, the trapping layer need not occur at the bottom of the floating substrate 32, i.e., it need not necessarily touch the buried oxide layer 24.

Figure 8E:
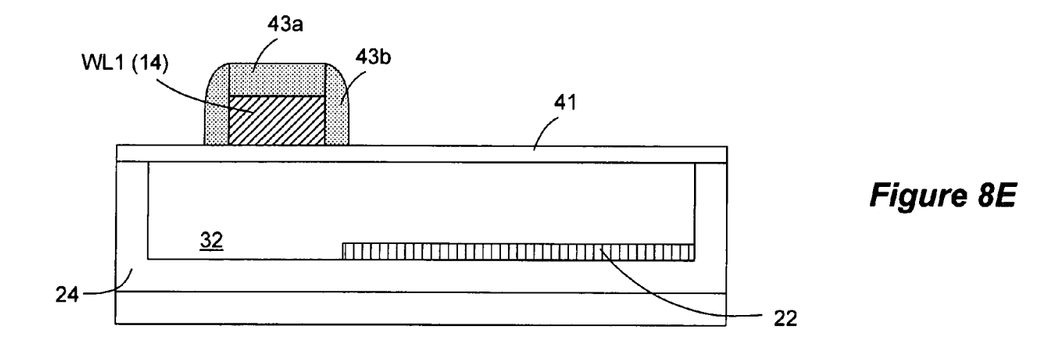

Next, and referring to FIG. 8E, a gate oxide 41 is formed on the resulting structure. Next a polysilicon layer is deposited which will comprise the material for the gate of the access transistor, i.e., the first word line 14. This polysilicon layer is heavily n-doped and may be silicided to improve its conductivity, although this is not shown. A dielectric hard mask layer 43a is then deposited on the polysilicon layer, and the resulting stack is patterned and etched to form the first word line 14 as shown. Thereafter, dielectric sidewalls 43b are formed on the sides of the hard mask/polysilicon stack using anisotropic etching techniques that are well known. As will be seen later, surrounding the first word line 14 with dielectric layers 43a, 43b in this fashion will allow the second word line 16 to be formed overlapping the first word line without fear of shorting the two together. These surrounding dielectric materials are preferably silicon nitride, but may comprise silicon dioxide or silicon oxynitride.

Figure 8F:
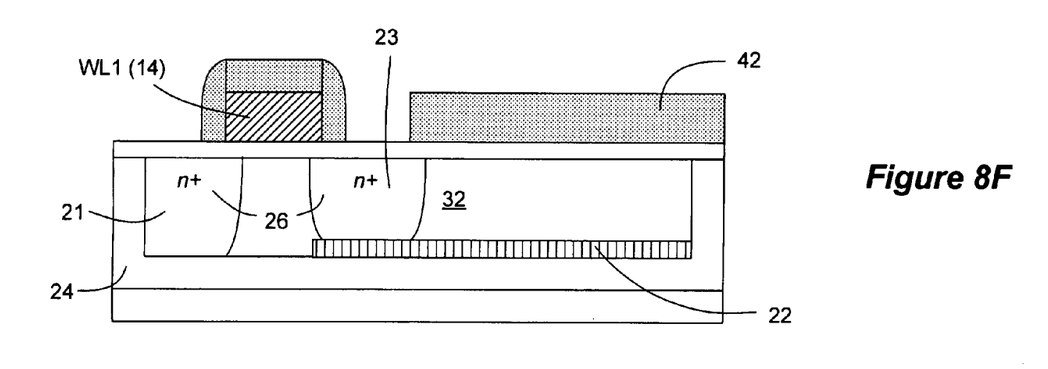

Next, and referring to FIG. 8F, another ion implantation mask 42 is preferably formed to define the source region 23 for the access transistor 18, which is also the cathode of the to-be-formed thyristor 20. Once this mask 42 is aligned, patterned, and etched as shown, ion implantation is used to inject n dopants (e.g., phosphorous, arsenic) into the exposed portions of substrate 32, thus forming the source 23 and drain 21 of the access transistor. The use of ion implantation mask 42 is preferred so that the underlying floating substrate portions corresponding to the future location of the thyristor 20 will not be affected by the n+ ion implantation step. Following ion implantation, the source/drain regions 26 are formed, and the hard mask 42 is removed. It should be noted that this ion implantation step (and subsequent ion implantation steps) should be suitably energetic to inject (or eventually drive by diffusion) the implanted ions down to the trapping layer 22 and/or the bottom of the floating substrate 32.

Figure 8G:
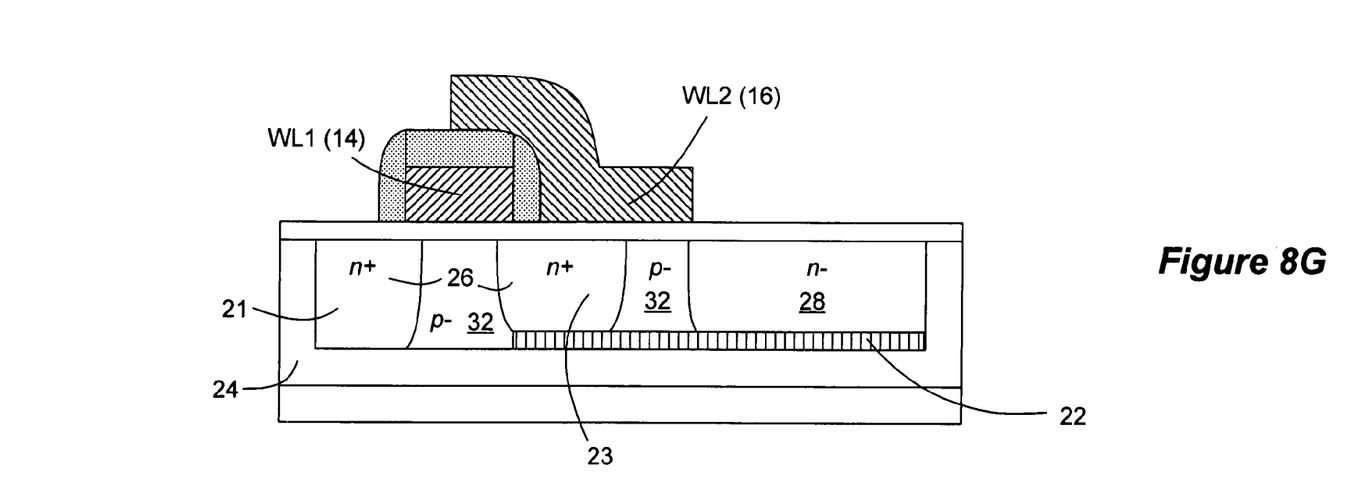

Next, and referring to FIG. 8G, the material for the second word line 16 (again, preferably polysilicon) is deposited and etched as shown. Once the second word line 16 is patterned, another n-dopant ion implantation step is used to counter-dope the exposed floating substrate to form n− doping regions 28 as shown. As shown, the edge of the second word line 16 is preferably used to self align doped region 28. Where the n dopants impinge upon the already n− doped drain 21, such doping will have little effect, and as a result drain 21 need not be masked during ion implantation.

Figure 8H:
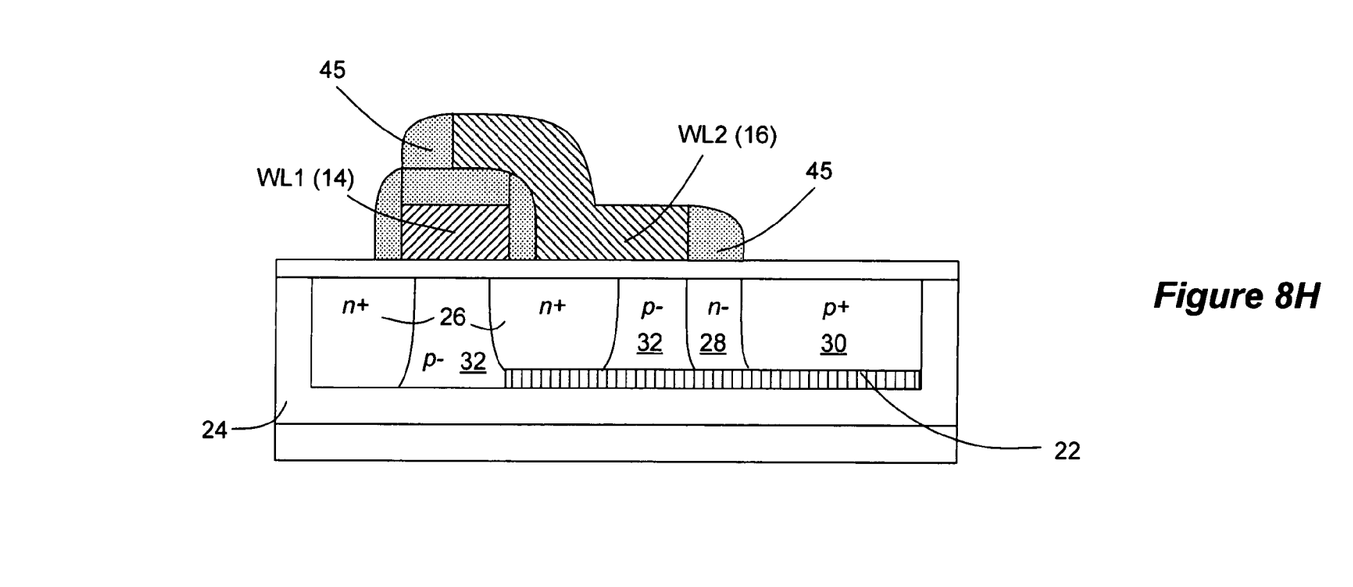

Next, and referring to FIG. 8H, dielectric sidewalls 45 are formed on the edges of the second word line 16. Where the sidewall 45 overlies the exposed silicon (on the right side in FIG. 8H), it acts as another ion implantation mask. Thus, after sidewall 45 formation, p doping is performed using the sidewall 45 to self-align and form p+ doping regions 30, thereby completing formation of the thyristor 20. As the drain 21 is n+ doped, it may be preferable mask the drain 21 during this ion implantation step (not shown).

Figure 8I:
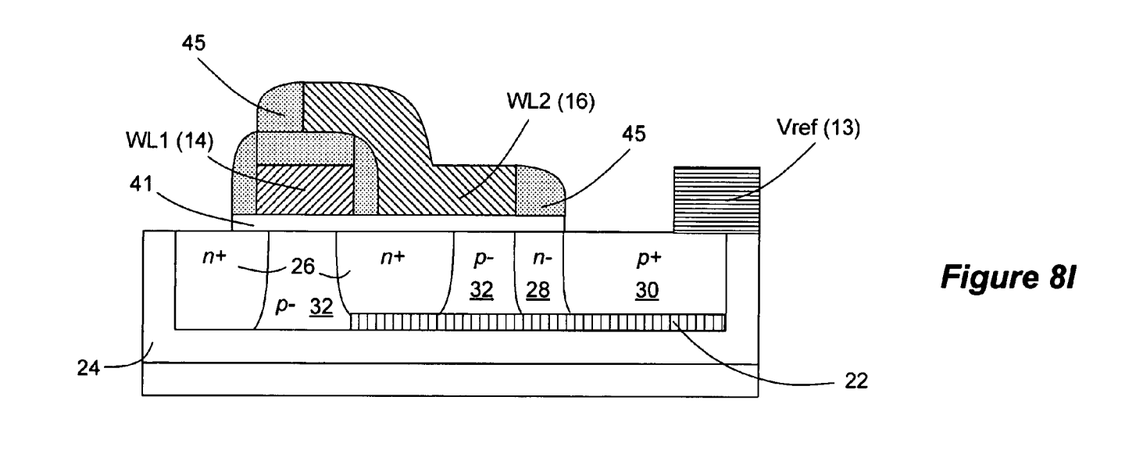

Thereafter, and referring to FIG. 8I, the gate dielectric 41 is removed where it is exposed. (Such removal of the date dielectric 41 may occur when the sidewalls 45 are formed). Then, a conductive layer is deposited and etched to form the Vref 13 contacts for the each of the cells. As will be seen in FIG. 9, the Vref 13 contact (as well as the other gates structures 14 and 16) preferably comprise lines which span over various cells to form rows in the memory array. The Vref contact 13 is preferably formed of polysilicon. While illustrated as being a made from a polysilicon layer separate from those used to form the other gate structures 14 and 16, one skilled in the art will realize that the one of these earlier polysilicon layers can be used to concurrently form the Vref contacts 13, although provisions must be made in this circumstance to etch the gate dielectric 41 which would otherwise reside underneath the Vref contact 13.

Figure 8J:
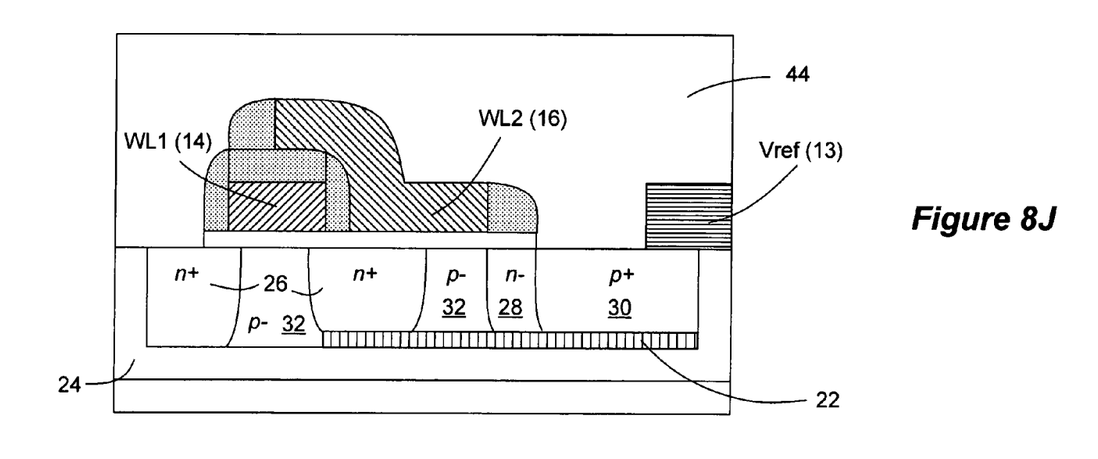
Figure 8K:
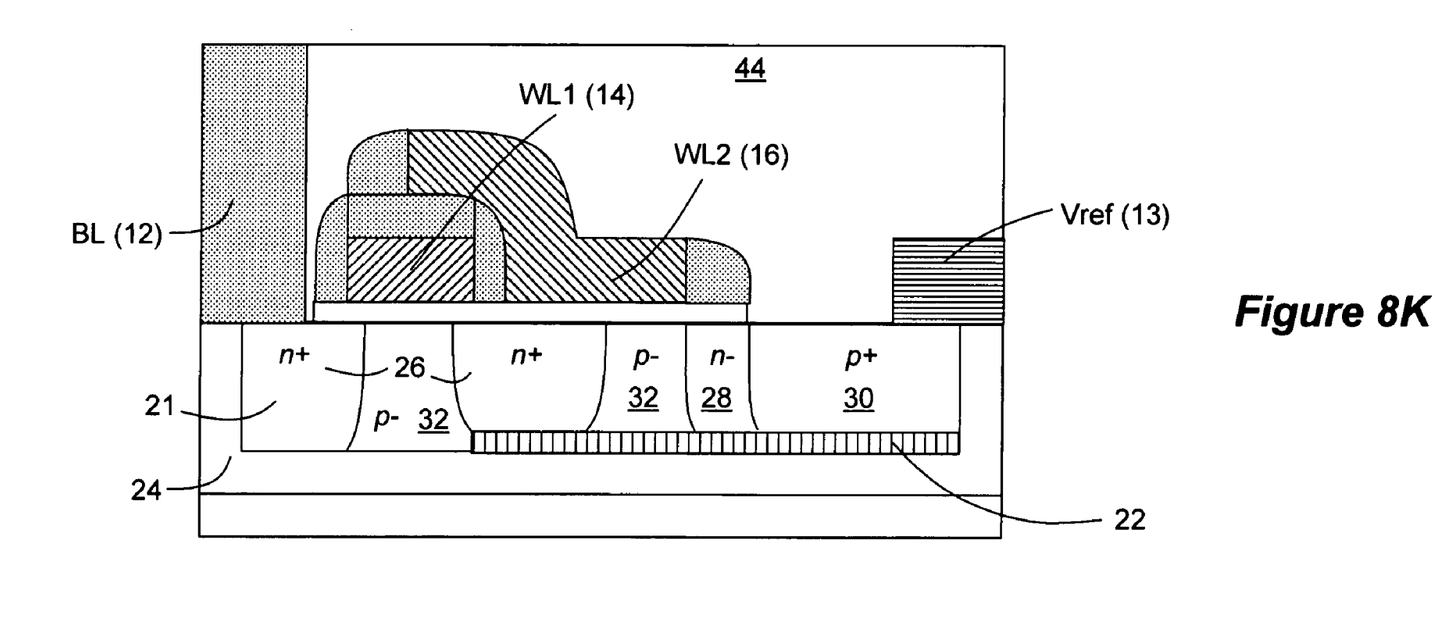

Thereafter, and referring to FIG. 8J, a dielectric layer 44 is deposited over the resulting structure, which is preferably a silicon dioxide. If necessary, this layer can be formed of several sub-layers, and can be planarized (e.g., with chemical-mechanical planarization) to render it flat for subsequent patterning. Finally, as shown in FIG. 8K, contact holes or vias are etched in the dielectric layer 44 to expose the drain 21, which are then subsequently filled with suitable conductive materials (polysilicon, aluminum, etc.) to form the bit line contacts 12 (e.g., plugs). Thereafter, the cell is processed to completion using standard processing techniques (not shown).

Figure 9:
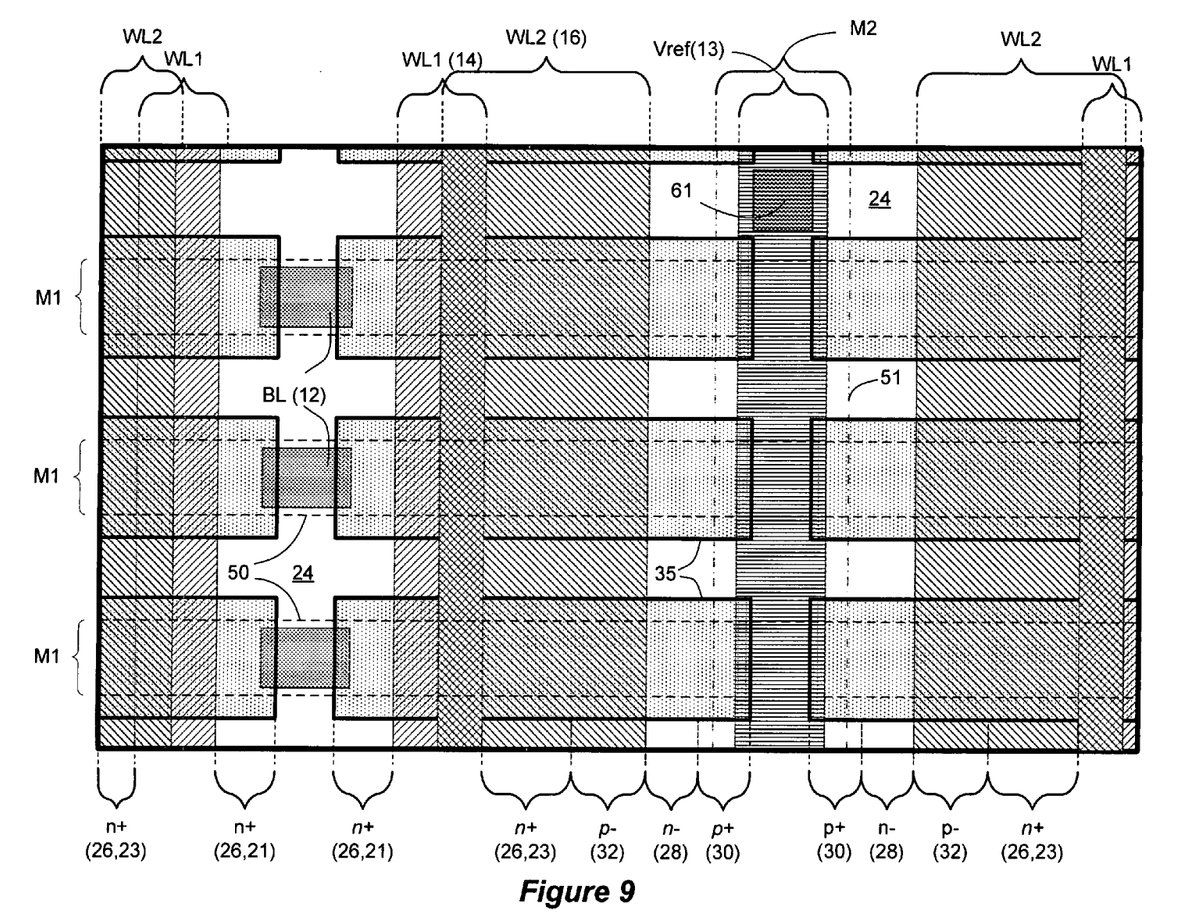
FIG. 9 illustrates a top view of the layout of the improved memory cell of FIG. 4.

A layout of the cell of FIGS. 8A–8K to form an array of cells is shown in FIG. 9. Shown are the active areas 35 of the cell and the isolation 24 that surrounds each. In a preferred embodiment, the bit line contacts 12 couple to bit lines 50, which are shown in dotted lines and which run from left to right to form columns in the memory array. Such bit lines 50 are preferably formed in a first level of metal (M1), as is well known. As noted earlier, the Vref contacts for the cells can comprise a common polysilicon line 13 which contacts the p+ regions 30 of each cell. Ultimately, the polysilicon line 13 makes contact to a metal line 51 formed in a second level of metal (M2) which runs orthogonal to and over the first metal bit lines 50. The second metal lines 51 feed the Vref reference voltage to the polysilicon line via a contacts 61 etched through the dielectric between the metals layers (not shown) and the dielectric layer 44 (see FIG. 8J). Where this contact 61 is formed, extra space between the active regions 35 and the first metal level bit lines 50 may be beneficial, and such contacts can occur at logical intervals along the length of the polysilicon line 13, such as every eight or sixteen bit lines 50.

Alternatively, and although not shown, the Vref contact to the p+ regions 30 may made by plugs in the same way that the bit line plugs are formed (see FIG. 8K), and in fact they may be made concurrently. If this alternative technique is utilized, care must be taken when forming the bit lines 50 to ensure that they do not short to the Vref plugs, e.g., by "jogging around" them in some fashion. The Vref plugs may then be coupled to the second level metal lines 51 though vias as is known. In short, and as noted earlier, they are many different ways to form the disclosed cell and to lay it out to achieve desired functionality and processing convenience. The disclosed methods and layout and merely exemplary.

Although the use of a floating substrate and a trapping layer are preferred in conjunction, one skilled in the art will realize that either of these aspects could be used alone. That is, the trapping layer need not be used in all embodiments, nor need a floating substrate be used in all embodiments. Indeed, in some embodiments, neither a floating substrate nor a trapping layer are required, as benefits in cell architecture and design are had merely through the use of the lateral thyristor, which is disposed entirely in the substrate. In some embodiments, other isolation schemes can be used other than through the use of a buried oxide layer 24a (See FIG. 8A). Moreover, while it is preferred that the memory cell utilize a lateral transistor, this is not strictly required in all embodiments, as the thyristor could also be vertical, or lateral and vertical in nature.

It should be understood that the inventive concepts disclosed herein are capable of many modifications. To the extent such modifications fall within the scope of the appended claims and their equivalents, they are intended to be covered by this patent.

What is claimed is:

1. A memory cell, comprising:
   a floating substrate insulated by insulation;
   a thyristor disposed in the substrate, wherein the thyristor is controlled by a first gate;
   an access transistor serially coupled to the thyristor, wherein the access transistor is controlled by a second gate; and
   a trapping layer discrete from the insulation and disposed in the substrate for storing charge to affect conductance of the memory cell.

2. The memory cell of claim 1, wherein affecting the conductance of the memory cell comprises affecting the conductance of the thyristor and the access transistor.

3. The memory cell of claim 1, wherein the thyristor comprises a lateral thyristor disposed entirely in the substrate.

4. The memory cell of claim 1, wherein the first and second gates are insulated from the substrate.

5. The memory cell of claim 1, wherein the trapping layer comprises a dielectric.

6. The memory cell of claim 5, wherein the dielectric is selected from the group consisting of silicon oxynitride, silicon nitride, silicon-rich nitride, silicon-rich oxide, or alumina.

7. The memory cell of claim 1, wherein an anode of the thyristor is coupled to a reference voltage.

8. The memory cell of claim 7, wherein the reference voltage is between an operating voltage of the memory cell and ground.

9. The memory cell of claim 1, wherein the first and second gates are overlapping.

10. The memory cell of claim 1, wherein the thyristor gate is separated form the thyristor by a dielectric.

11. The memory cell of claim 1, wherein the memory cell is non-volatile.

12. A memory cell, comprising:
a floating substrate insulated by insulation;
a thyristor disposed in the substrate, wherein the thyristor is controlled by a first gate;
an access transistor serially coupled to the thyristorherein the access transistor is controlled by a second gate; and
means disposed in the substrate for storing charge to affect conductance of the memory cell, wherein the means comprises a layer discrete from the insulation.

13. The memory cell of claim 12, wherein affecting the conductance of the memory cell comprises affecting the conductance of the thyristor and the access transistor.

14. The memory cell of claim 12, wherein the thyristor comprises a lateral thyristor disposed entirely in the substrate.

15. The memory cell of claim 12, wherein the first and second gates are insulated from the substrate.

16. The memory cell of claim 12, wherein an anode of the thyristor is coupled to a reference voltage.

17. The memory cell of claim 12, wherein the first and second gates are overlapping.

18. The memory cell of claim 12, wherein the memory cell is non-volatile.

19. A memory cell, comprising:
a floating substrate insulated by insulation;
a lateral thyristor disposed entirely in the substrate, wherein the lateral thyristor is gated by a first gate;
an access transistor formed in the substrate and serially coupled to the thyristor, wherein the access transistor is controlled by a second gate; and
a trapping dielectric layer discrete from the insulation and disposed in the floating substrate.

20. The memory cell of claim 19, wherein the memory cell is non-volatile and retains data states when power is removed from the memory cell.

21. The memory cell of claim 19, wherein the first and second gates are insulated from the substrate.

22. The memory cell of claim 19, wherein the trapping dielectric layer is selected from the group consisting of silicon oxynitride, silicon nitride, silicon-rich nitride, silicon-rich oxide, or alumina.

23. The memory cell of claim 19, wherein an anode of the thyristor is coupled to a reference voltage.

24. The memory cell of claim 23, wherein the anode is coupled to a second level of metal.

25. The memory cell of claim 23, wherein the reference voltage is between an operating voltage of the memory cell and ground.

26. The memory cell of claim 19, wherein the access transistor and thyristor both comprise polysilicon gates.

27. The memory cell of claim 26, wherein the gates are overlapping.

28. The memory cell of claim 19, wherein a drain of the access transistor is coupled to a bit line formed in a first level of metal.

29. An integrated circuit, comprising:
a plurality of memory cells arranged in rows and columns, each memory cell comprising:
a floating substrate insulated by insulation;
a thyristor disposed in the substrate;
an access transistor serially coupled to the thyristor; and
a trapping layer discrete from the insulation and disposed in the substrate for storing charge to affect conductance of the memory cells.

30. The integrated circuit of claim 29, wherein affecting the conductance of the memory cells comprises affecting the conductance of the thyristor and the access transistor.

31. The integrated circuit of claim 29, wherein the thyristor comprises a lateral thyristor disposed entirely in the substrate.

32. The integrated circuit of claim 29, wherein the access transistor is coupled to the thyristor via a doped region common to both.

33. The integrated circuit of claim 29, wherein an anode of the thyristor is coupled to a reference voltage.

34. The integrated circuit of claim 33, wherein the reference voltage is between an operating voltage of the integrated circuit and ground.

35. The integrated circuit of claim 29, wherein the thyristor is gated.

36. An integrated circuit, comprising:
a plurality of memory cells arranged in rows and columns, each memory cell comprising:
a floating substrate insulated by insulation;
a thyristor disposed in the substrate;
an access transistor serially coupled to the thyristor; and
means disposed in the substrate for storing charge to affect conductance of memory cells, wherein the means comprises a layer discrete from the insulation.

37. The integrated circuit of claim 36, wherein affecting the conductance of the memory cells comprises affecting the conductance of the thyristor and the access transistor.

38. The integrated circuit of claim 36, wherein the thyristor comprises a lateral thyristor disposed entirely in the substrate.

39. The integrated circuit of claim 36, wherein the access transistor is coupled to the thyristor via a doped region common to both.

40. The integrated circuit of claim 36, wherein an anode of the thyristor is coupled to a reference voltage.

41. The integrated circuit of claim 36, wherein the thyristor is gated.

42. An integrated circuit, comprising:
a plurality of memory cells arranged in rows and columns, each memory cell comprising:
a floating substrate insulated by insulation;
a lateral thyristor disposed entirely in the substrate, wherein the lateral thyristor is gated;
an access transistor formed in the substrate and serially coupled to the thyristor; and
a trapping dielectric layer discrete from the insulation and disposed in the floating substrate.

43. The integrated circuit of claim 42, wherein the memory cells are non-volatile and retain data states when power is removed from the memory cells.

44. The integrated circuit of claim 42, wherein the access transistor is coupled to the thyristor for each cell via a doped region common to both.

45. The integrated circuit of claim 42, wherein the trapping dielectric layer is selected from the group consisting of silicon oxynitride, silicon nitride, silicon-rich nitride, silicon-rich oxide, or alumina.

46. The integrated circuit of claim 42, wherein an anode of the thyristor for each cell is coupled to a reference voltage.

47. The integrated circuit of claim 46, wherein the anode is coupled to a second level of metal.

48. The integrated circuit of claim 46, wherein the reference voltage is between an operating voltage of the memory cell and ground.

49. The integrated circuit of claim 42, wherein the access transistor and thyristor for each cell both comprise polysilicon gates.

50. The integrated circuit of claim 49, wherein the gates are overlapping.

51. The integrated circuit of claim 42, wherein a drain of the access transistor is coupled to a bit line formed in a first level of metal.

* * * * *